US012580541B2

(12) United States Patent　　　　　(10) Patent No.:　US 12,580,541 B2
Deng et al.　　　　　　　　　　　　(45) Date of Patent:　Mar. 17, 2026

(54) GAIN EQUALIZER AND METHOD FOR CONTROLLING TUNABLE GAIN OF GAIN EQUALIZER

(71) Applicant: MEDIATEK INC., Hsin-Chu (TW)

(72) Inventors: Zhiming Deng, San Jose, CA (US); Qian Zhong, San Jose, CA (US); Li Gao, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 606 days.

(21) Appl. No.: 18/086,600

(22) Filed: Dec. 21, 2022

(65) Prior Publication Data

US 2023/0412136 A1　　Dec. 21, 2023

Related U.S. Application Data

(60) Provisional application No. 63/352,342, filed on Jun. 15, 2022.

(51) Int. Cl.
　　*H03F 3/45*　　　　(2006.01)
　　*H03F 1/22*　　　　(2006.01)
　　　　　　(Continued)

(52) U.S. Cl.
　　CPC .............. *H03G 5/165* (2013.01); *H03G 3/30* (2013.01); *H03F 1/223* (2013.01); *H03F 3/191* (2013.01);
　　　　　　(Continued)

(58) Field of Classification Search
　　CPC .... H03G 5/165; H03G 3/30; H03G 2201/103; H03G 1/0029; H03G 1/0088; H03G 3/001; H03G 1/0023; H03G 3/45098; H03G 3/3042; H03F 2200/451; H03F 3/19; H03F 3/45242; H03F 2203/45376;
(Continued)

(56) References Cited

U.S. PATENT DOCUMENTS 7,292,102 B2 *　11/2007　Lee ...................... H03G 1/0029
　　　　　　　　　　　　　　　　　330/253
7,352,241 B2 *　4/2008　Lee ...................... H03F 3/45188
　　　　　　　　　　　　　　　　　330/254
(Continued)

FOREIGN PATENT DOCUMENTS

TW　　　　202042496 A　　11/2020

*Primary Examiner* — Khanh V Nguyen
(74) *Attorney, Agent, or Firm* — Winston Hsu

(57)　　　ABSTRACT

A gain equalizer and a method for controlling a tunable gain of the gain equalizer are provided. The gain equalizer includes a common source stage and a switch array. The common source stage is configured to apply the tunable gain to an input signal, in order to generate an amplified signal. The common source stage includes input transistors and cascode transistors, wherein the cascode transistors are respectively coupled to the input transistors. The input transistors are configured to receive the input signal via gate terminals of the input transistors, respectively, and the cascode transistors are configured to output the amplified signal via drain terminals of the cascode transistors, respectively. In addition, the switch array is coupled between respective source terminals of the cascode transistors, wherein the tunable gain is controlled according to an equivalent impedance of the switch array.

18 Claims, 6 Drawing Sheets

(51) Int. Cl.

| | | |
|---|---|---|
| *H03G 3/30* | (2006.01) | |
| *H03G 5/16* | (2006.01) | |
| *H03F 3/191* | (2006.01) | |
| *H03G 5/02* | (2006.01) | |

(52) U.S. Cl.
CPC ....... *H03G 5/025* (2013.01); *H03G 2201/103* (2013.01)

(58) Field of Classification Search
CPC . H03F 2203/45481; H03F 2203/45731; H03F 1/3211; H03F 3/45188; H03F 3/45183
USPC .................................................. 330/278, 254
See application file for complete search history.

(56) References Cited

U.S. PATENT DOCUMENTS

| | | | |
|---|---|---|---|
| 7,554,404 B2 * | 6/2009 | Roufoogaran .......... | H03F 3/211 330/261 |
| 10,110,177 B1 | 10/2018 | Koroglu | |
| 2006/0071712 A1 | 4/2006 | Lee | |
| 2018/0302051 A1 | 10/2018 | Ma | |
| 2022/0021363 A1 * | 1/2022 | Cui ...................... | H03G 1/0029 |

* cited by examiner

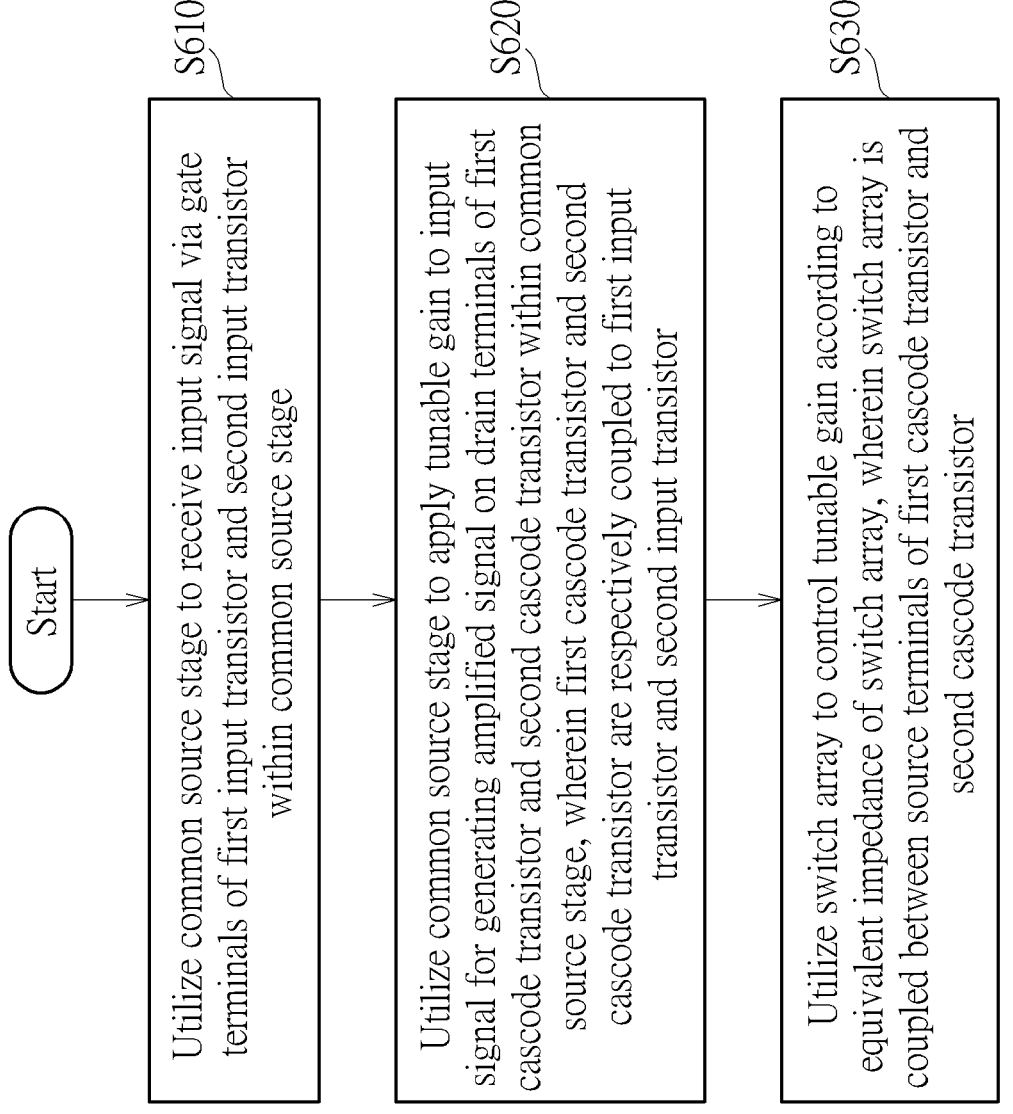

Start

S610
Utilize common source stage to receive input signal via gate terminals of first input transistor and second input transistor within common source stage S620
Utilize common source stage to apply tunable gain to input signal for generating amplified signal on drain terminals of first cascode transistor and second cascode transistor within common source stage, wherein first cascode transistor and second cascode transistor are respectively coupled to first input transistor and second input transistor S630
Utilize switch array to control tunable gain according to equivalent impedance of switch array, wherein switch array is coupled between source terminals of first cascode transistor and second cascode transistor

FIG. 6

GAIN EQUALIZER AND METHOD FOR CONTROLLING TUNABLE GAIN OF GAIN EQUALIZER

CROSS REFERENCE TO RELATED APPLICATIONS

This application claims the benefit of U.S. Provisional Application No. 63/352,342, filed on Jun. 15, 2022. The content of the application is incorporated herein by reference.

BACKGROUND

The present invention is related to gain equalization, and more particularly, to a gain equalizer and a method for controlling a tunable gain of the gain equalizer.

Gain equalizers are typically placed in parallel signal paths for compensating gain variation caused by some path settings and the phase-shifting operation. It is preferable to design a gain equalizer with fine gain step resolution, a wide gain tuning range and small phase variation for different gain settings. In practice, the design of the gain equalizer may face several challenges when some blocks are added into the gain equalizer for achieving the design requirements mentioned above. For example, these blocks may result in that absolute gain values, gain flatness over frequencies, linearity noise related performance, etc., may be sensitive to process variation, and the overall power consumption may be greatly increased in order to ensure that the specifications mentioned above can meet the targets under all process corners.

Thus, there is a need for a novel architecture of the gain equalizer and an associated method, which can make the gain equalizer meet the design requirements without introducing any side effects or in a way that is less likely to introduce side effects.

SUMMARY

An objective of the present invention is to provide a gain equalizer and a method for controlling a tunable gain of the gain equalizer, in order to optimize overall performance of the gain equalizer (which includes gain step resolution, gain tuning range, minimized phase variation with respect to different gain settings, etc.) without worsening performance related to gain precision, gain flatness, linearity, noise, etc.

At least one embodiment of the present invention provides a gain equalizer. The gain equalizer comprises a first common source stage and a first switch array. The first common source stage is configured to apply a tunable gain to an input signal, in order to generate an amplified signal. The first common source stage comprises a first input transistor, a second input transistor, a first cascode transistor and a second cascode transistor, wherein the first cascode transistor and the second cascode transistor are respectively coupled to the first input transistor and the second input transistor. The first input transistor and the second input transistor are configured to receive the input signal via gate terminals of the first input transistor and the second input transistor, respectively, and the first cascode transistor and the second cascode transistor are configured to output the amplified signal via drain terminals of the first cascode transistor and the second cascode transistor, respectively. In addition, the first switch array is coupled between respective source terminals of the first cascode transistor and the second cascode transistor, wherein the tunable gain is controlled according to an equivalent impedance of the first switch array.

At least one embodiment of the present invention provides a method for controlling a tunable gain of a gain equalizer. The method comprises: utilizing a first common source stage of the gain equalizer to receive an input signal via gate terminals of a first input transistor and a second input transistor within the first common source stage, respectively; utilizing the first common source stage to apply the tunable gain to the input signal for generating the amplified signal on drain terminals of a first cascode transistor and a second cascode transistor within the first common source stage, respectively, wherein the first cascode transistor and the second cascode transistor are respectively coupled to the first input transistor and the second input transistor; and utilizing a first switch array of the gain equalizer to control the tunable gain according to an equivalent impedance of the first switch array, wherein the first switch array is coupled between respective source terminals of the first cascode transistor and the second cascode transistor.

The gain equalizer and the method provided by the embodiments of the present invention utilize a switch array to split output current for controlling the tunable gain. As the switch array is not placed at output nodes of a gain stage of the gain equalizer, frequency response of the gain equalizer will not be greatly impacted by the switch array. In addition, the switch array is not coupled to additional power supply terminal, and a re-modulation issue is therefore avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating a working flow of a method for controlling a tunable gain of a gain equalizer according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
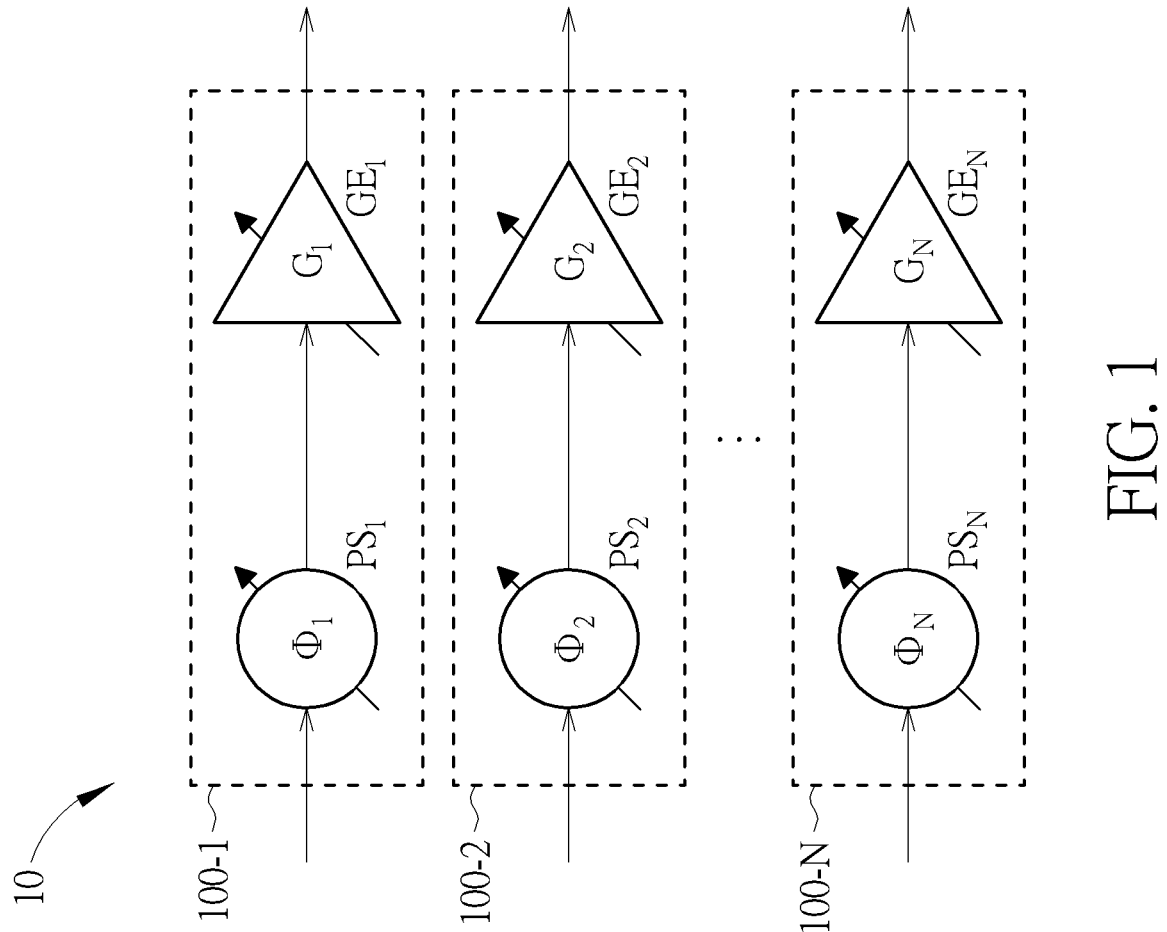
FIG. 1 is a diagram illustrating a phased array according to an embodiment of the present invention.

FIG. 1 is a diagram illustrating a phased array such as a radio frequency (RF) phase-shifting phased array 10 according to an embodiment of the present invention. As shown in FIG. 1, the RF phase-shifting phased array 10 may comprise multiple signal paths arranged in parallel, such as signal paths 100-1, 100-2, . . . , and 100-N, where N may represent a positive integer. In this embodiment, the signal path 100-1 may comprise a phase shifter $PS_1$ providing a phase shift $\Phi_1$ and a gain equalizer $GE_1$ providing a tunable gain $G_1$, and the signal path 100-2 may comprise a phase shifter $PS_2$ providing a phase shift $\Phi_2$ and a gain equalizer $GE_2$ providing a tunable gain $G_2$, where the rest may be deduced by analogy, for example, the signal path 100-N may comprise a phase shifter $PS_N$ providing a phase shift $\Phi_N$ and a gain equalizer $GE_N$ providing a tunable gain $G_N$. In practice, in addition to different phase shifts $\Phi_1$, $\Phi_1$, . . . , and $\Phi_N$, the phase shifters $PS_1$, $PS_1$, . . . , and $PS_N$ may provide different gains. Thus, the gain equalizers $GE_1$, $GE_1$, . . . , and $GE_N$ are configured to apply corresponding gains to signals on the paths 100-1, 100-2, . . . , and 100-N, in order to compensate the gains provided by the phase shifters $PS_1$, $PS_1$, . . . , and $PS_N$. Thus, gain precision, gain step resolution and gain tuning range of each of the gain equalizers $GE_1$, $GE_1$, . . . , and $GE_N$ needs to be optimized, in order to make overall gains of the paths 100-1, 100-2, . . . , and 100-N as much equal as possible. In practice, the gain equalizers $GE_1$, $GE_1$, . . . , and $GE_N$ also provide phase shifts, however. Thus, it is preferable to minimize the phase shifts provided by the gain equalizers $GE_1$, $GE_1$, . . . , and $GE_N$, in order to prevent designs of the gain equalizers $GE_1$, $GE_1$, . . . , and $GE_N$ and the phase shifters $PS_1$, $PS_1$, . . . , and $PS_N$ from iterative modification.

Figure 2:
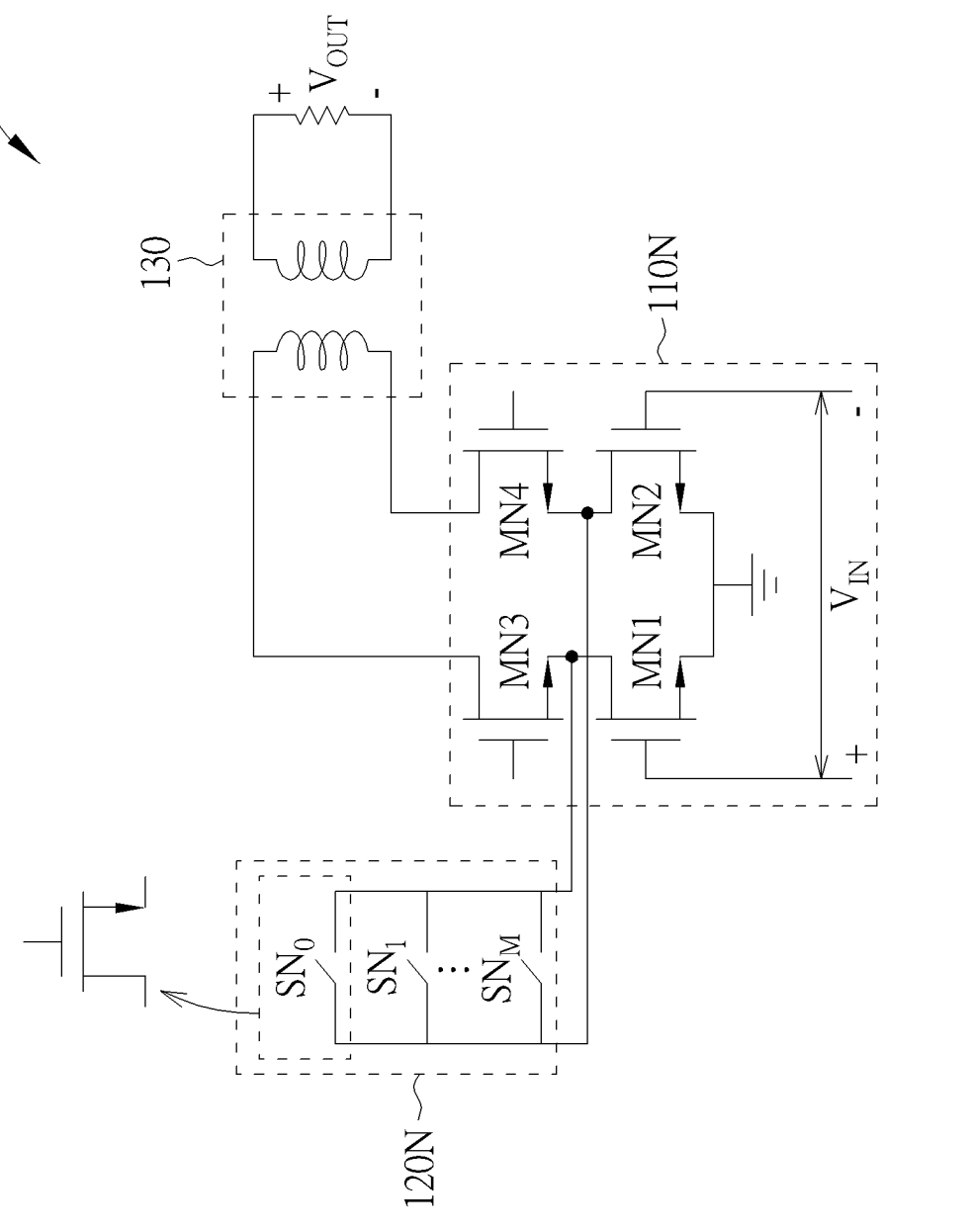
FIG. 2 is a diagram illustrating a gain equalizer according to an embodiment of the present invention.

FIG. 2 is a diagram illustrating a gain equalizer 20 according to an embodiment of the present invention. As shown in FIG. 2, the gain equalizer 20 may comprise a common source stage 110N and a transformer such as a balanced to unbalanced (Balun) transformer 130. The common source stage 110N is configured to apply a tunable gain to an input signal $V_{IN}$, in order to generate an amplified signal, and the Balun transformer 130 is configured to convert the amplified signal into an output signal V OUT (e.g. converting a differential amplified signal generated by a differential architecture of the common source stage 110N into a single-ended output signal) on loading (illustrated by a resistor in figures for better comprehension) of next stage. In detail, the common source stage 110N may comprise a first input transistor and a second input transistor, such as input transistors MN1 and MN2, where the input transistors MN1 and MN2 are configured to receive the input signal $V_{IN}$ via gate terminals of the input transistors MN1 and MN2, respectively, and source terminals of the input transistors are coupled to a reference terminal such as a ground voltage terminal. The common source stage 110N may further comprise a first cascode transistor and a second cascode transistor, such as cascode transistors MN3 and MN4, where a source terminal of the cascode transistor MN3 is coupled to a drain terminal of the input transistor MN1, and a source terminal of the cascode transistor MN4 is coupled to a drain terminal of the input transistor MN2. Drain terminals of the cascode transistors MN3 and MN4 are coupled to the Balun transformer 130, and the cascode transistors MN3 and MN4 are configured to output the amplified signal via the drain terminals thereof.

In some embodiments, a switched-resistor tank may be coupled between the drain terminals of the. By changing an overall resistance of the switched-resistor tank in order to change an overall output load of the common source stage 110N, the tunable gain can be changed. The Balun transformer 130 is implemented by inductors. Resistors within the switched-resistor tank and the inductors within the Balun transformer are different types of components, which means load caused by the Balun transformer 130 and load caused by the switched-resistor tank is unable to track each other, and thereby makes the tunable gain of the common source stage 110N be sensitive to process variation. In addition, gain step resolution and a tuning range of the tunable gain may vary over frequencies because the resistors and the inductors have different frequency responses, thereby impacting gain flatness. Thus, over design regarding both of the gain resolution and the tuning range may be required when adopting the switched-resistor tank, resulting that power consumption increases.

In some embodiment, one or more current-steering transistors may be coupled between the drain terminal of the cascode transistor MN3 and the source terminal of the cascode transistor MN4, and one or more current-steering transistors may be coupled between the drain terminal of the cascode transistor MN4 and the source terminal of the cascode transistor MN3. By changing the number of enabled transistor among these current-steering, the tunable gain can be changed. These current-steering transistors are nonlinear components, which may worsen an overall linearity of the gain equalizer 10. In addition, drain capacitances of these current-steering transistors may result in increase of overall output capacitive load of the common source stage 110N, which may further worsen the overall linearity of the gain equalizer 10, and increase of the overall power consumption may be required in order to meet similar linearity performance in comparison with an architecture without using these current-steering transistors.

In some embodiment, source terminals of current-steering transistors may be coupled to the source terminals of the cascode transistors MN3 and MN4, and drain terminals of these current-steering transistors may be coupled to a reference terminal. By changing the number of enabled transistor among these current-steering, in order to change current flowing through output of the common source stage 110N, the tunable gain can be changed. As these current-steering transistors is not directly connected to the drain terminals of the drain terminals of the transistors MN3 and MN4, overall output load of the common source stage 110N is less impacted. There are still some disadvantages, however. In practice, the reference terminal is unable to be an ideal alternating current (AC) ground, and steered current of these current steering transistors flowing to this reference terminal may result in re-modulation, making this reference terminal become an interference source.

In the embodiment of FIG. 2, the gain equalizer 20 may comprise a switch array 120N coupled between the source terminals of the cascode transistors MN3 and MN4, where the tunable gain can be controlled according to an equivalent impedance of the switch array 120N. In particular, the switch array 120N may comprise multiple switches such as $SN_0$, $SN_1$, . . . , and $SN_M$, and the switches $SN_0$, $SN_1$, . . . , and $SN_M$ are connected in parallel between the source terminals of the cascode transistors MN3 and MN4, where M may represent a positive integer. In this embodiment, the equivalent impedance of the switch array 120N can be determined by controlling whether any of the switches $SN_0$, $SN_1$, . . . , and $SN_M$ is turned on or off. For example, each of the switches $SN_0$, $SN_1$, . . . , and $SN_M$ may be controlled by a corresponding bit of a digital code, where different values of this digital code may correspond to different combinations of turned-on switches among the switches $SN_0$, $SN_1$, . . . , and $SN_M$, thereby resulting in different equivalent impedances of the switch array 120N, respectively. As the equivalent impedances of the switch array 120N is tunable, a steered-away current flowing through the switch array 120N can be tunable, and an output current of the common source stage 110N flowing to the Balun transformer 130 can be tunable, resulting that the tunable gain of the gain equalizer 20 can be tunable.

In some embodiments, the switches $SN_0$, $SN_1$, . . . , and $SN_M$ may have the same turned-on resistance (e.g. the switches $SN_0$, $SN_1$, . . . , and $SN_M$ is implemented by the same size of transistors). In some embodiments, the switches $SN_0$, $SN_1$, . . . , and SN M may have different turned-on resistances (e.g. the switches $SN_0$, $SN_1$, . . . , and $SN_M$ is implemented by different sizes of transistors). In some embodiment, the digital code may be a binary code or a thermometer code.

It should be noted that all devices within the switch array 120N are active devices. In detail, each of the input transistors MN1 and MN2 and the cascode transistors MN3 and MN4 is an N-type transistor such as an N-type Metal-Oxide-Semiconductor Field-Effect Transistor (NMOS), and each of the switches $SN_0$, $SN_1$, . . . , and $SN_M$ may comprise an N-type transistor such as an NMOS. As all devices within the switch array 120N and all devices within the common source stage 110N are implemented with the same type of devices (e.g. N-type transistors), electronic behaviors of the switch array 120N can track the electronic behaviors of the common source stage 110N over process variation. Thus, the current steered by the switch array 120N is substantially determined based on a device ratio of the transistors within the switch array 120N and the transistors (e.g. the cascode transistors MN3 and MN4) within the common source stage 110N, and is therefore less sensitive to the process variation. In addition, as the switch array 120N configured for implementing a gain tuning function is placed at cascode source nodes of the common source stage 110N (i.e. the source terminals of the cascode transistors MN3 and MN4), which have relative low impedance in comparison with output nodes of the common source stage 110N (i.e. the drain terminals of the cascode transistors MN3 and MN4), a frequency response variation over gain gears (e.g. over different gain settings of the tunable gain) of the gain equalizer 20 can be minimized. As the switch array 120N does not increase the number of active devices at the output nodes of the common source stage 110N, impact to the linearity of the gain equalizer 20 caused by the switch array 120N can be minimized. Furthermore, the steered-away current flowing through the switch array 120N is steered away from one side of a differential architecture of the common source stage 110N to the other side of the differential architecture of the common source stage 110N, instead of being steering to a dedicated reference terminal, and the issue of re-modulation caused by the dedicated reference terminal can be avoided.

Figure 3:
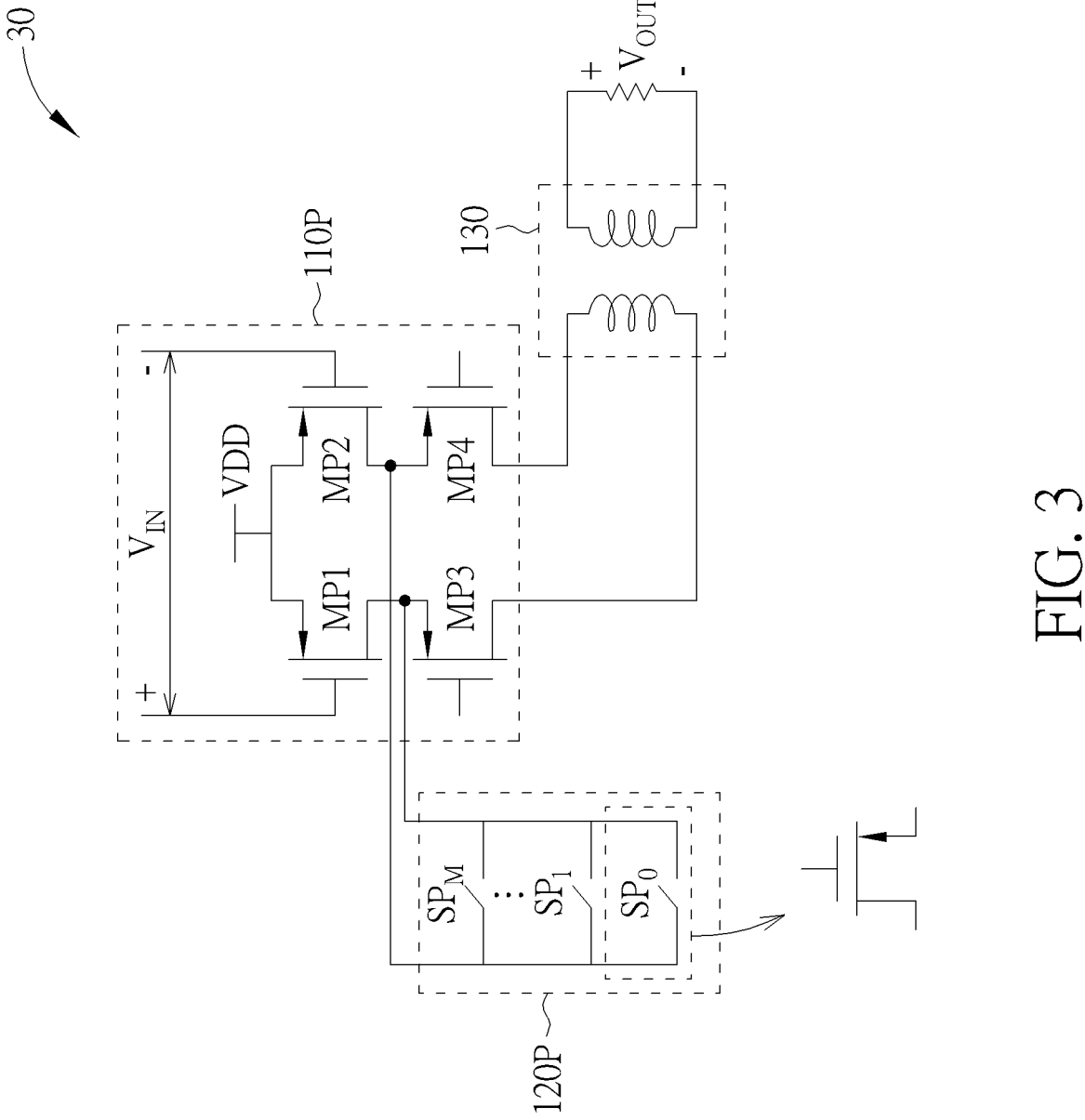
FIG. 3 is a diagram illustrating a gain equalizer according to another embodiment of the present invention.

FIG. 3 is a diagram illustrating a gain equalizer 30 according to another embodiment of the present invention. In comparison with the gain equalizer 20 shown in FIG. 2, a common source stage 110P and a switch array 120P shown in FIG. 3 may be alternative designs of the common source stage 110N and a switch array 120N, respectively. As shown in FIG. 3, the common source stage 110P may comprise input transistors MP1 and MP2 and cascode transistors MP3 and MP4. Main differences between the common source stages 110N and 110P are that each of the input transistors MP1 and MP2 and the cascode transistors MP3 and MP4 may be a P-type transistor such as a P-type Metal-Oxide-Semiconductor Field-Effect Transistor (PMOS), and source terminals of the input transistors MP1 and MP2 are coupled to a supply voltage terminal VDD. The switch array 120P may comprise multiple switches such as SP1, SP2, . . . , and $SP_M$, where a main difference between the switch arrays 120N and 120P is that each of the switches SP1, SP2, . . . , and $SP_M$ may comprise a P-type transistor such as a PMOS. Operations and advantages of the gain equalizer 30 are similar to the gain equalizer 20, related details are not repeated here for brevity.

Figure 4:
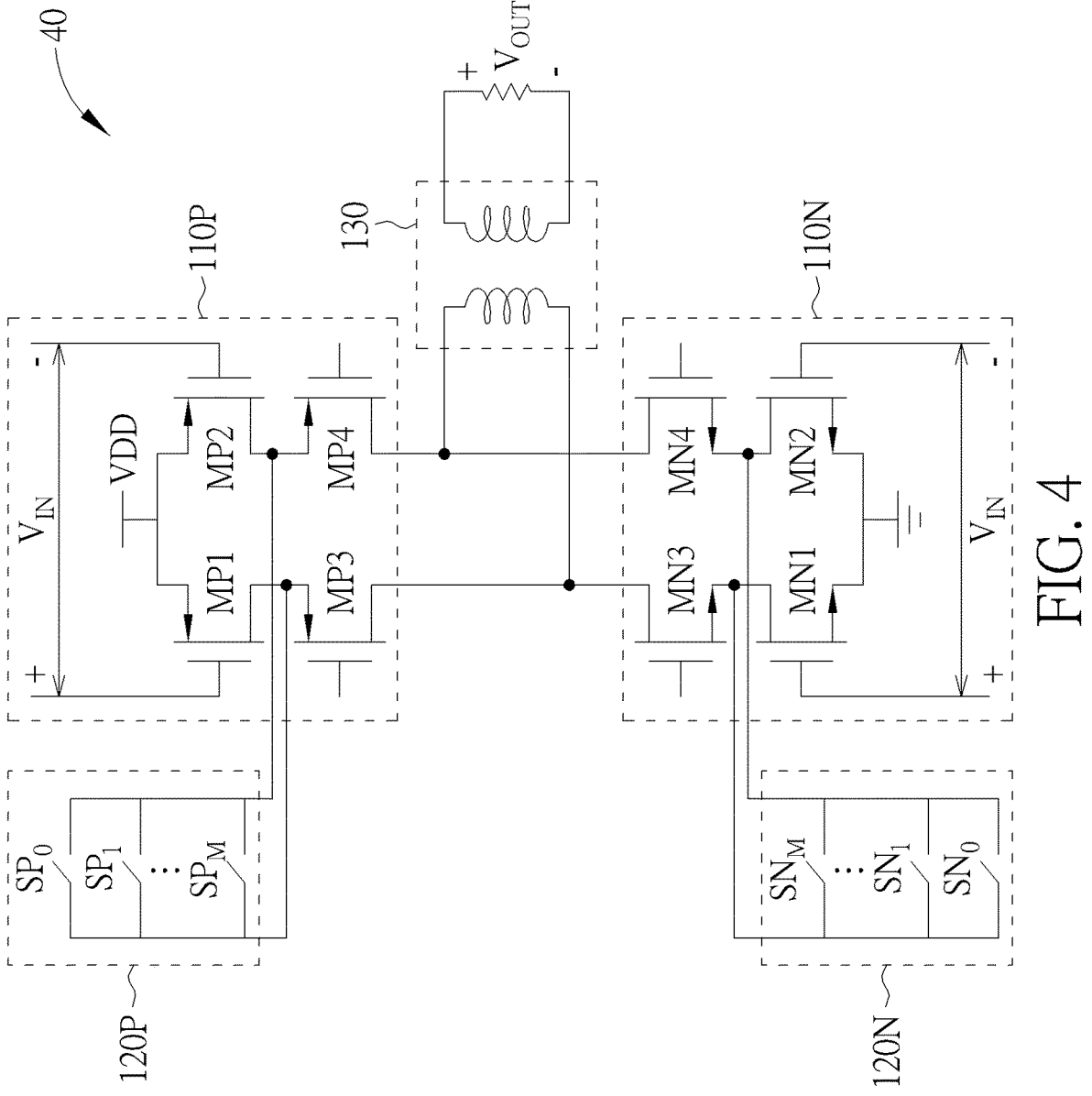
FIG. 4 is a diagram illustrating a gain equalizer according to yet another embodiment of the present invention.

FIG. 4 is a diagram illustrating a gain equalizer 40 according to yet another embodiment of the present invention. As shown in FIG. 4, the gain equalizer 40 may comprise the common source stages 110N and 110P, the switch arrays 120N and 120P, and the Balun transformer 130. In this embodiment, all of the input transistors MN1, MN2, MP1 and MP2 are configured to receive the input signal $V_{IN}$ via gate terminals thereof, respectively, where the cascode transistor MP3 is coupled between the input transistor MP1 and the drain terminal of the cascode transistor MN3, and the cascode transistor MP4 is coupled between the input transistor MP2 and the drain terminal of the cascode transistor MN4. Thus, the common mode stages 110N and 110P may form a push-pull gain stage, which can improve a driving efficiency of the gain equalizer 40 in comparison with utilizing a single common source stage such as the embodiments of FIG. 2 and FIG. 3. Based on the architecture of the push-pull gain stage, the switch array 120N is coupled between the source terminals of the cascode transistors MN3 and MN4, and the switch array 120P is coupled between the source terminals of the cascode transistors MP3 and MP4. Thus, a tunable gain of the gain equalizer 40 may be controlled according to equivalent impedances of the switch arrays 120N and 120P.

In this embodiment, as each of the input transistors MN1 and MN2 and the cascode transistors MN3 and MN4 is an N-type transistor, and each switch within the switch array 120N may comprise an N-type transistor, the current steered by the switch array 120N is substantially determined based on the device ratio of the transistors within the switch array 120N and the transistors (e.g. the cascode transistors MN3 and MN4) within the common source stage 110N. In addition, as each of the input transistors MP1 and MP2 and the cascode transistors MP3 and MP4 is a P-type transistor, and each switch within the switch array 120P may comprise a P-type transistor, the current steered by the switch array 120P is substantially determined based on the device ratio of the transistors within the switch array 120P and the transistors (e.g. the cascode transistors MP3 and MP4) within the common source stage 110P. As the gain equalizer 40 may be regarded as a combined architecture of the gain equalizers 20 and 30, the advantages of the gain equalizers 20 and 30 can be included in the gain equalizer 40, and related details are omitted here for brevity.

Figure 5:
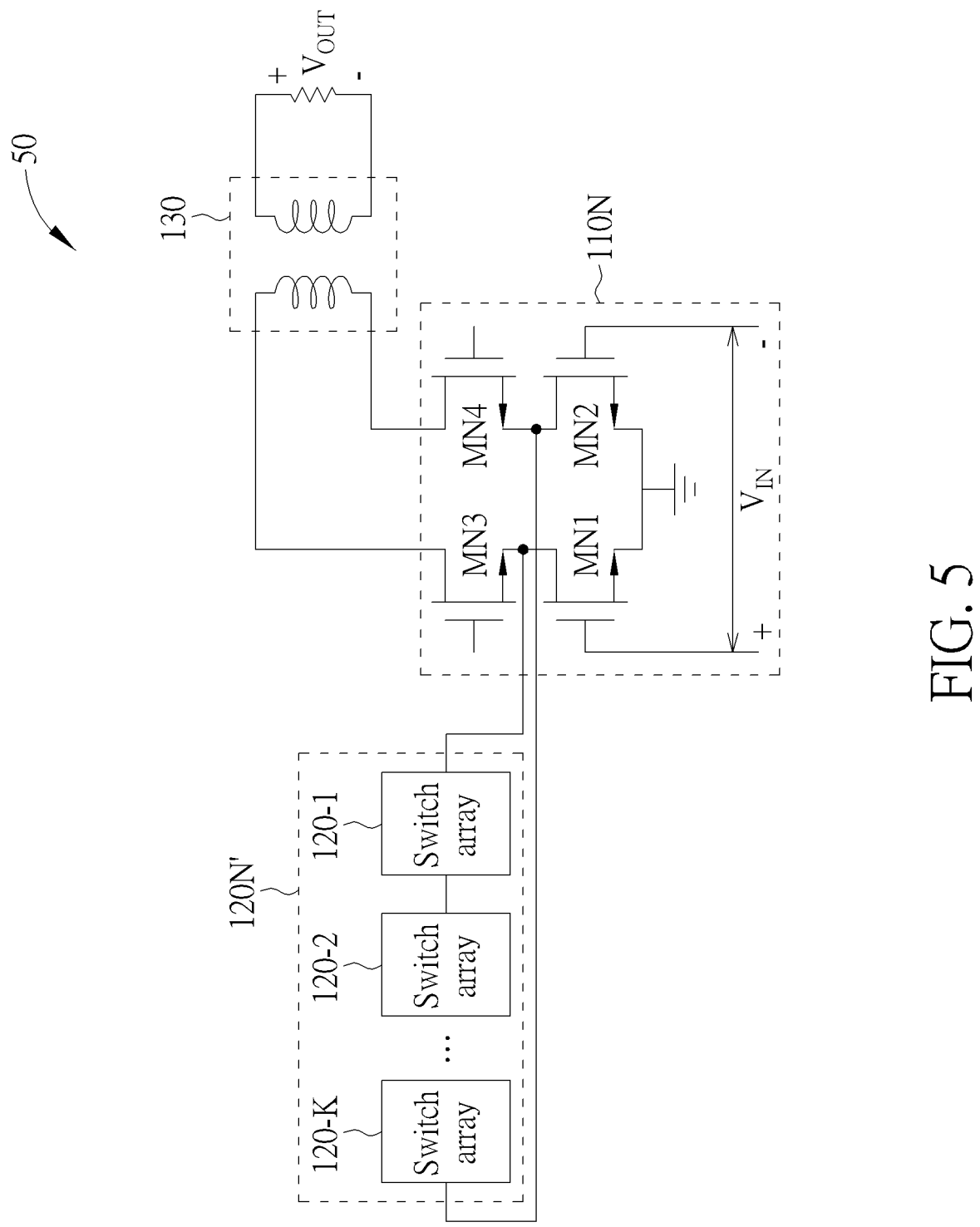
FIG. 5 is a diagram illustrating a gain equalizer according to still another embodiment of the present invention.

FIG. 5 is a diagram illustrating a gain equalizer 50 according to still another embodiment of the present invention. The gain equalizer 50 is a special architecture which is obtained by changing the implementation of the switch array 120N based on the gain equalizer 20 shown in FIG. 2. In detail, the switch array 120N may be replaced with a switch array 120N' which comprises multiple switch sub-arrays such as switch sub-arrays 120-1, 120-2, . . . , and 120-K (labeled "Switch array" for brevity) connected in series, and an equivalent impedance of each switch sub-array of the switch sub-arrays 120-1, 120-2, . . . , and 120-K is tunable, where K may represent a positive integer. For example, each switch sub-array of the switch sub-arrays 120-1, 120-2, . . . , and 120-K may comprise multiple switches connected in parallel between a first end (e.g. a right-side terminal illustrated in FIG. 5) and a second end (e.g. a left-side terminal illustrated in FIG. 5) of said each switch sub-array, and the switch sub-arrays 120-1, 120-2, . . . , and 120-K are connected in series via the first end and the second end of said each switch sub-array, where the switch array 120N may be an example of any of the switch sub-arrays 120-1, 120-2, . . . , and 120-K. As shown in FIG. 1, the first end (e.g. the right-side terminal) of the switch sub-array 120-1 is coupled to the source terminal of the cascode transistor MN3, the first end (e.g. the right-side terminal) of the switch sub-array 120-2 is coupled to the second end (e.g. the left-side terminal) of the switch sub-array 120-1, and the rest may be deduced by analogy, where the second end (e.g. the left-side terminal) of the switch sub-array 120-K is coupled to the source terminal of the cascode transistor MN4. Based on the architecture of the switch array comprising the switch sub-arrays 120-1, 120-2, . . . , and 120-K connected in series, step resolution of tuning an overall equivalent impedance of the switch array 120N' can be improved in comparison with the embodiment of FIG. 2, to thereby improve gain step resolution of a tunable gain of the gain equalizer 50.

In some embodiment, the number of switches within each of the switch sub-arrays 120-1, 120-2, . . . , and 120-K may be the same. In some embodiment, the number of switches within each of the switch sub-arrays 120-1, 120-2, . . . , and 120-K may be different from one another. It should be noted that the embodiment of FIG. 5 takes the architecture of utilizing N-type transistors as an example for illustration, but the present invention is not limited thereto. More particularly, the technique of improving the gain step resolution by connecting multiple switch sub-arrays in series as mentioned above can be adopted in the architecture of an N-type common source stage (e.g. the common source stage 110N shown in FIG. 2), the architecture of a P-type common source stage (e.g. the common source stage 110P shown in FIG. 3) and the architecture of a push-pull gain stage (e.g. the push-pull gain stage comprising the common source stages 110N and 110P shown in FIG. 4). Those skilled in this art should understand how to adopt this technique in different topologies according to the above descriptions, and related details are omitted here for brevity.

FIG. 6 is a diagram illustrating a working flow of a method for controlling a tunable gain of a gain equalizer according to an embodiment of the present invention, where the method is applicable to any of the gain equalizers 10, 20, 30, 40 and 50. It should be noted that the working flow shown in FIG. 6 is for illustrative purpose only, and is not meant to be a limitation of the present invention. For example, one or more steps may be added, deleted or modified in the working flow shown in FIG. 6. In addition, if an overall result is not hindered, these steps do not have to be executed in the exact order shown in FIG. 6.

In Step S610, the gain equalizer may utilize a common source stage thereof to receive an input signal via gate terminals of a first input transistor and a second input transistor within the common source stage, respectively.

In Step S620, the gain equalizer may utilize the common source stage to apply the tunable gain to the input signal for generating the amplified signal on drain terminals of a first cascode transistor and a second cascode transistor within the common source stage, respectively, wherein the first cascode transistor and the second cascode transistor are respectively coupled to the first input transistor and the second input transistor.

In Step S630, the gain equalizer may utilize a switch array thereof to control the tunable gain according to an equivalent impedance of the switch array, wherein the switch array is coupled between respective source terminals of the first cascode transistor and the second cascode transistor.

To summarize, the gain equalizer and the associated method provided by the embodiments of the present invention implement the function of controlling the tunable gain of the gain equalizer by configuring a switch array coupled between the cascode source nodes of the common source amplifier within the gain equalizer, which can make the gain equalizer meet the requirements of the gain step resolution and the gain tuning range without introducing any side effects or in a way that is less likely to introduce side effects such as linearity issues, sensitivity issues related to process variation and frequency response variation over gain gears.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gain equalizer, comprising:
a first common source stage, configured to apply a tunable gain to an input signal, in order to generate an amplified signal, wherein the first common source stage comprises:
  a first input transistor and a second input transistor, configured to receive the input signal via gate terminals of the first input transistor and the second input transistor, respectively; and
  a first cascode transistor and a second cascode transistor, respectively coupled to the first input transistor and the second input transistor, configured to output the amplified signal via drain terminals of the first cascode transistor and the second cascode transistor, respectively;
a first switch array, coupled between respective source terminals of the first cascode transistor and the second cascode transistor, wherein the tunable gain is controlled according to an equivalent impedance of the first switch array;
a second common source stage, comprising:
  a third input transistor and a fourth input transistor, configured to receive the input signal via gate terminals of the third input transistor and the fourth input transistor, respectively; and
  a third cascode transistor and a fourth cascode transistor, wherein the third cascode transistor is coupled between the third input transistor and the drain terminal of the first cascode transistor, and the fourth cascode transistor is coupled between the fourth input transistor and the drain terminal of the second cascode transistor; and
a second switch array, coupled between respective source terminals of the third cascode transistor and the fourth cascode transistor, wherein the tunable gain is further controlled according to an equivalent impedance of the second switch array.

2. The gain equalizer of claim 1, wherein the first switch array comprises multiple switches, and the multiple switches are connected in parallel between the respective source terminals of the first cascode transistor and the second cascode transistor.

3. The gain equalizer of claim 2, wherein the equivalent impedance of the first switch array is determined by controlling whether any of the multiple switches is turned on or off.

4. The gain equalizer of claim 2, wherein each of the first input transistor, the second input transistor, the first cascode transistor and the second cascode transistor is an N-type transistor, and each of the multiple switches comprises an N-type transistor.

5. The gain equalizer of claim 2, wherein each of the first input transistor, the second input transistor, the first cascode transistor and the second cascode transistor is a P-type transistor, and each of the multiple switches comprises a P-type transistor.

6. The gain equalizer of claim 1, wherein each of the first input transistor, the second input transistor, the first cascode transistor and the second cascode transistor is an N-type transistor, each switch within the first switch array comprises an N-type transistor, each of the third input transistor, the fourth input transistor, the third cascode transistor and the fourth cascode transistor is a P-type transistor, and each switch within the second switch array comprises a P-type transistor.

7. The gain equalizer of claim 1, wherein the first switch array comprises multiple switch sub-arrays connected in series, and an equivalent impedance of each switch sub-array of the multiple switch sub-arrays is tunable.

8. The gain equalizer of claim 7, wherein said each switch sub-array comprises multiple switches connected in parallel between a first end and a second end of said each switch sub-array, and the multiple switch sub-arrays are connected in series via the first end and the second end of said each switch sub-array.

9. The gain equalizer of claim 1, further comprising:

a transformer, coupled to the drain terminals of the first cascode transistor and the second cascode transistor, configured to convert the amplified signal into an output signal.

10. A method for controlling a tunable gain of a gain equalizer, comprising:

utilizing a first common source stage of the gain equalizer to receive an input signal via gate terminals of a first input transistor and a second input transistor within the first common source stage, respectively;

utilizing the first common source stage to apply the tunable gain to the input signal for generating the amplified signal on drain terminals of a first cascode transistor and a second cascode transistor within the first common source stage, respectively, wherein the first cascode transistor and the second cascode transistor are respectively coupled to the first input transistor and the second input transistor;

utilizing a first switch array of the gain equalizer to control the tunable gain according to an equivalent impedance of the first switch array, wherein the first switch array is coupled between respective source terminals of the first cascode transistor and the second cascode transistor;

receiving the input signal via gate terminals of a third input transistor and a fourth input transistor within a second common source stage, respectively, wherein a third cascode transistor within the second common source stage is coupled between the third input transistor and the drain terminal of the first cascode transistor, and a fourth cascode transistor within the second common source stage is coupled between the fourth input transistor and the drain terminal of the second cascode transistor; and utilizing a second switch array of the gain equalizer to further control the tunable gain according to an equivalent impedance of the second switch array, wherein the second switch array is coupled between respective source terminals of the third cascode transistor and the fourth cascode transistor, wherein the tunable gain is further controlled according to an equivalent impedance of the second switch array.

11. The method of claim 10, wherein the first switch array comprises multiple switches, and the multiple switches are connected in parallel between the respective source terminals of the first cascode transistor and the second cascode transistor.

12. The method of claim 11, wherein the equivalent impedance of the first switch array is determined by controlling whether any of the multiple switches is turned on or off.

13. The method of claim 11, wherein each of the first input transistor, the second input transistor, the first cascode transistor and the second cascode transistor is an N-type transistor, and each of the multiple switches comprises an N-type transistor.

14. The method of claim 11, wherein each of the first input transistor, the second input transistor, the first cascode transistor and the second cascode transistor is a P-type transistor, and each of the multiple switches comprises a P-type transistor.

15. The method of claim 10, wherein each of the first input transistor, the second input transistor, the first cascode transistor and the second cascode transistor is an N-type transistor, each switch within the first switch array comprises an N-type transistor, each of the third input transistor, the fourth input transistor, the third cascode transistor and the fourth cascode transistor is a P-type transistor, and each switch within the second switch array comprises a P-type transistor.

16. The method of claim 10, wherein the first switch array comprises multiple switch sub-arrays connected in series, and an equivalent impedance of each switch sub-array of the multiple switch sub-arrays is tunable.

17. The method of claim 16, wherein said each switch sub-array comprises multiple switches connected in parallel between a first end and a second end of said each switch sub-array, and the multiple switch sub-arrays are connected in series via the first end and the second end of said each switch sub-array.

18. The method of claim 10, further comprising:

utilizing a transformer coupled to the drain terminals of the first cascode transistor and the second cascode transistor to convert the amplified signal into an output signal.

* * * * *